(12) United States Patent
Takezawa et al.

(10) Patent No.: US 11,749,530 B2
(45) Date of Patent: Sep. 5, 2023

(54) METHOD OF REMOVING PHOSPHORUS-DOPED SILICON FILM AND SYSTEM THEREFOR

(71) Applicant: Tokyo Electron Limited, Tokyo (JP)

(72) Inventors: Yoshihiro Takezawa, Nirasaki (JP); Masahisa Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/304,116

(22) Filed: Jun. 15, 2021

(65) Prior Publication Data

US 2021/0398817 A1  Dec. 23, 2021

(30) Foreign Application Priority Data

Jun. 19, 2020 (JP) .................... 2020-106427

(51) Int. Cl.
*H01L 21/311* (2006.01)
*H01L 21/306* (2006.01)
*H01L 21/02* (2006.01)
*H01L 21/67* (2006.01)

(52) U.S. Cl.
CPC .. *H01L 21/31111* (2013.01); *H01L 21/02236* (2013.01); *H01L 21/30604* (2013.01); *H01L 21/67063* (2013.01)

(58) Field of Classification Search
None
See application file for complete search history.

(56) References Cited

U.S. PATENT DOCUMENTS

| | | | | |
|---|---|---|---|---|
| 9,202,708 | B1* | 12/2015 | Chen | H01L 21/31116 |
| 2003/0119280 | A1* | 6/2003 | Lee | H01L 21/76254 |
| | | | | 438/479 |
| 2004/0106300 | A1* | 6/2004 | Young | H01L 21/76802 |
| | | | | 257/E21.252 |
| 2006/0046428 | A1* | 3/2006 | Baiocco | H01L 21/76232 |
| | | | | 257/E21.549 |
| 2007/0056926 | A1 | 3/2007 | Ko | |
| 2012/0236467 | A1* | 9/2012 | Kang | B82Y 10/00 |
| | | | | 257/532 |
| 2015/0270366 | A1* | 9/2015 | Purayath | H01L 29/788 |
| | | | | 257/315 |
| 2015/0371866 | A1* | 12/2015 | Chen | H01L 21/31116 |
| | | | | 438/715 |

FOREIGN PATENT DOCUMENTS

JP 2009-508354 A 2/2009

* cited by examiner

*Primary Examiner* — Allan W. Olsen (74) *Attorney, Agent, or Firm* — Armstrong Teasdale LLP (57) ABSTRACT

A method of removing a phosphorus-doped silicon film doped with phosphorus, includes: forming a silicon oxide film by oxidizing the phosphorus-doped silicon film in a substrate including the phosphorus-doped silicon film and an undoped silicon film which is not been doped with the phosphorus, wherein at least the phosphorus-doped silicon film is exposed to a surface of the substrate; and selectively etching and removing the silicon oxide film from the silicon oxide film and the undoped silicon film.

12 Claims, 5 Drawing Sheets

METHOD OF REMOVING PHOSPHORUS-DOPED SILICON FILM AND SYSTEM THEREFOR

CROSS-REFERENCE TO RELATED APPLICATION

This application is based upon and claims the benefit of priority from Japanese Patent Application No. 2020-106427, filed on Jun. 19, 2020, the entire contents of which are incorporated herein by reference.

TECHNICAL FIELD

The present disclosure relates to a method of removing a phosphorus-doped silicon film and a system therefor.

BACKGROUND

In a semiconductor manufacturing process, a silicon film doped with phosphorus (hereinafter, referred to as a "phosphorus-doped silicon film") may be formed on, for example, a semiconductor wafer (hereinafter, referred to as a "wafer") which is a substrate.

In addition, in the semiconductor manufacturing process, etching processing is performed to remove an unnecessary film or process the shape of a film. The etching processing includes dry etching in which an etching gas is supplied to the wafer and wet etching in which the wafer is immersed in an etching solution for etching. A film to be etched is brought into contact with the etching gas or the etching solution, and removed through a chemical reaction.

Here, when trying to remove the phosphorus-doped silicon film by etching, if the same substrate contains a phosphorus-free silicon film (hereinafter, referred to as an "undoped silicon film"), a high selectivity may not be obtained. Thus, the undoped silicon film may be etched together with the phosphorus-doped silicon film.

Patent Document 1 discloses a technique of etching a doped silicon layer and an undoped silicon layer from a wafer in which the doped silicon layer has been formed on the upper surface of the undoped silicon layer using a process composition containing $SF_6$ and a fluorocarbon gas.

Prior Art Document

Patent Document

Patent Document 1: Japanese Laid-Open Patent Publication No. 2009-508354

SUMMARY

A method of removing a phosphorus-doped silicon film doped with phosphorus, includes: forming a silicon oxide film by oxidizing the phosphorus-doped silicon film in a substrate including the phosphorus-doped silicon film and an undoped silicon film which is not doped with phosphorus, wherein at least the phosphorus-doped silicon film is exposed to a surface of the substrate; and selectively etching and removing the silicon oxide film from the silicon oxide film and the undoped silicon film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
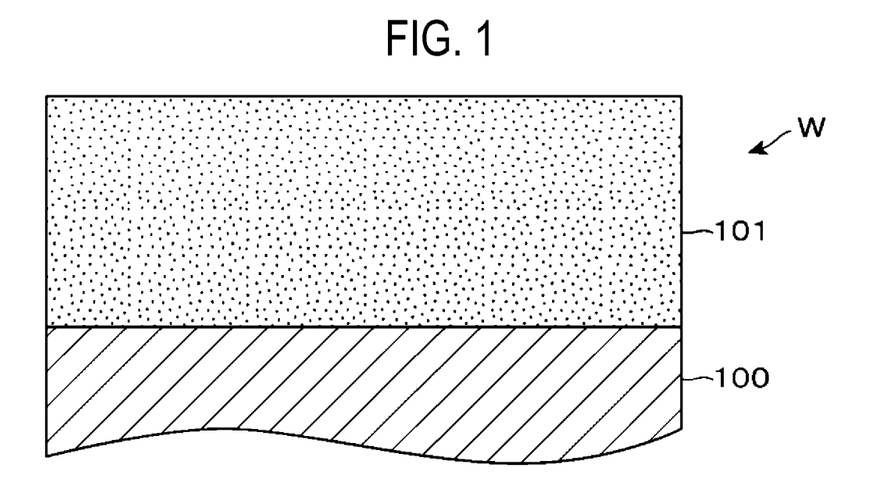
FIG. 1 is an enlarged cross-sectional view of a wafer to which a film removing method according to the present disclosure is applied.

An embodiment of a method of removing a phosphorus-doped silicon film (hereinafter, referred to as a "film removing method") according to the present disclosure will be described. FIG. 1 illustrates an exemplary structure near the surface of a wafer W to which the film removing method according to the present disclosure is applied. For example, an undoped silicon film 100, which has been formed using a monosilane gas by a CVD method and not been doped with phosphorus, is formed in the wafer W.

A silicon film doped with phosphorus (P) (hereinafter, referred to as "P-doped silicon film") 101 is formed on an upper surface of the undoped silicon film 100. The P-doped silicon film 101 may be formed by adding a phosphine ($PH_3$) gas as a monosilane gas on the upper surface of the undoped silicon film 100 through a CVD method. The P-doped silicon film 101 is formed with a thickness of, for example, about 1 μm. The concentration of P in the P-doped silicon film 101 is, for example, $8.0 \times 10^{20}$ atoms/cm$^3$. A surface of the above-mentioned P-doped silicon film 101 remains exposed on the surface of the wafer W.

In the wafer W thus provided, there is a need to remove only the P-doped silicon film 101 through etching while leaving the undoped silicon film 100. However, since the P-doped silicon film 101 and the undoped silicon film 100 have similar textures, it is difficult to obtain a large etching selectivity of the P-doped silicon film 101 to the undoped silicon film 100. Therefore, when etching is performed using an etching gas, such as a $Cl_2$ gas, not only the P-doped silicon film 101 as an upper layer but also the undoped silicon film 100 as a lower layer may be removed by the etching.

Under such circumstances, in the film removing method according to the present disclosure, an oxidation process of oxidizing the P-doped silicon film 101 is performed before etching the P-doped silicon film 101. As shown in test results to be described later, it was found that the P-doped silicon film 101 has a property of being more easily oxidized than the undoped silicon film 100 not doped with phosphorus. Therefore, by using such a property difference, it is possible to keep the undoped silicon film 100 in an unoxidized state even if the oxidation process of oxidizing the P-doped silicon film 101 were performed to form a silicon oxide film 102. Since there are etchants with a high selectivity for the silicon oxide film 102 with respect to the undoped silicon film 100, it is possible to remove the silicon oxide film 102 while avoiding etching of the undoped silicon film 100.

In carrying out the above-mentioned oxidation process, it is preferable to oxidize the entire P-doped silicon film 101 so as to turn the P-doped silicon film 101 into the silicon oxide film 102. Meanwhile, when the thickness of the P-doped silicon film 101 is too thick, it may not be possible to sufficiently oxidize a layer portion which is spaced apart deeply from the surface of the P-doped silicon film 101. Furthermore, it takes some time to oxidize the P-doped silicon film 101 so as to form the silicon oxide film 102. Thus, by thinly forming the P-doped silicon film 101, it is possible to shorten the time required for the oxidation process.

Figure 2:
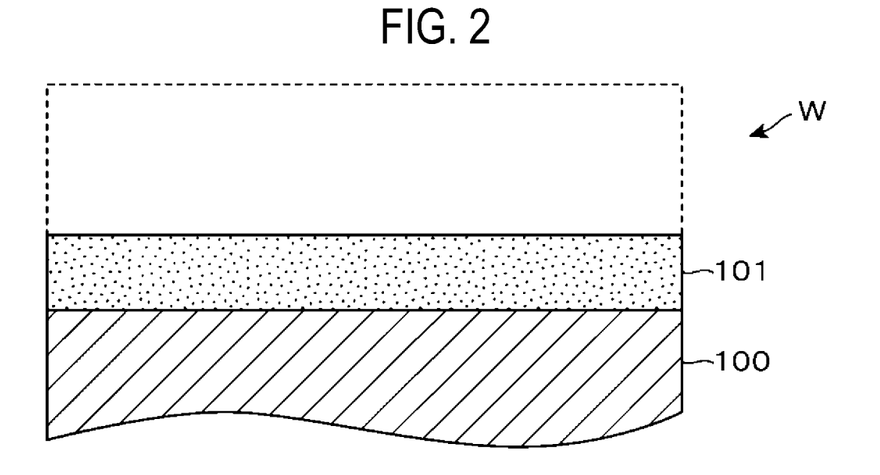
FIG. 2 is a first enlarged vertical cross-sectional view illustrating a step of removing a phosphorus-doped silicon film.

Therefore, the wafer W illustrated in FIG. 1 is first transferred to an etching apparatus, and as illustrated in FIG. 2, etching is performed such that the thickness of the P-doped silicon film 101 falls within a range of 10 to 100 nm, for example, 15 nm. In FIG. 2, the thickness of the P-doped silicon film 101 after the etching is shown on a large scale.

Figure 3:
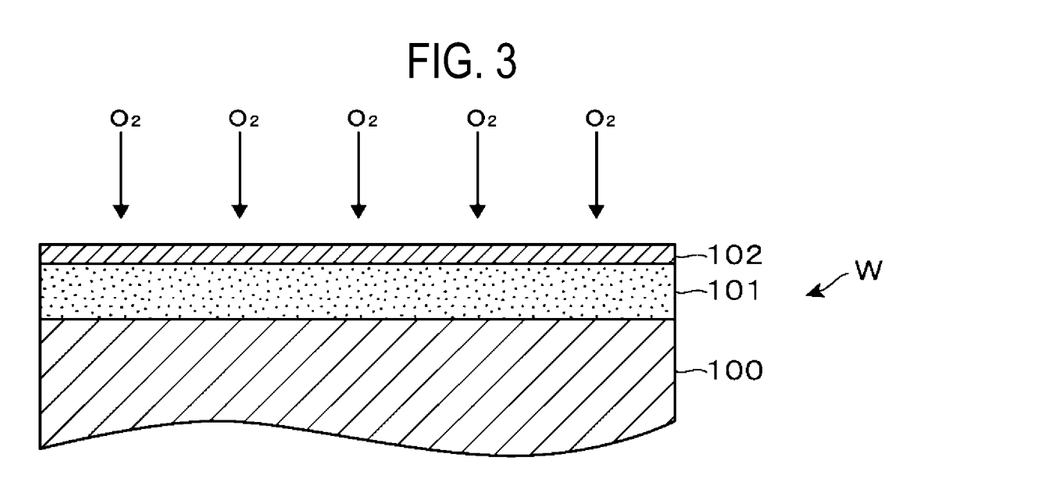
FIG. 3 is a second enlarged vertical cross-sectional view illustrating a step of removing the phosphorus-doped silicon film.

Thereafter, the wafer W illustrated in FIG. 2 is transferred to an apparatus, for example, a heat treatment apparatus, for forming the silicon oxide film 102 by oxidizing the P-doped silicon film 101. In the heat treatment apparatus, the wafer W is heated at 800 degrees C. for 40 minutes while being supplied with, for example, an oxygen ($O_2$) gas. In the oxidation process, since $O_2$ diffuses from the surface of the wafer W toward the deep layer portion, the oxidation of the P-doped silicon film 101 gradually progresses as illustrated in FIG. 3. After a predetermined period of time, the entire P-doped silicon film 101 is oxidized and thus the silicon oxide film 102 is formed. The thickness of the silicon oxide film 102 formed through the oxidation of the P-doped silicon film 101 increases with the oxidation. For the sake of convenience in illustration, an illustration of the increase in the film thickness is omitted in FIGS. 3 and 4.

For example, the P-doped silicon film 101 is completely oxidized over about 30 minutes from the start of heating so that the silicon oxide film 102 is formed. When the oxidation process is continued even after the silicon oxide film 102 is formed, $O_2$ reaches the undoped silicon film 100 from the side of the silicon oxide film 102. At this time, since the undoped silicon film 100 is less likely to be oxidized compared with the P-doped silicon film 101, the oxidation of the undoped silicon film 100 hardly progresses.

Figure 4:
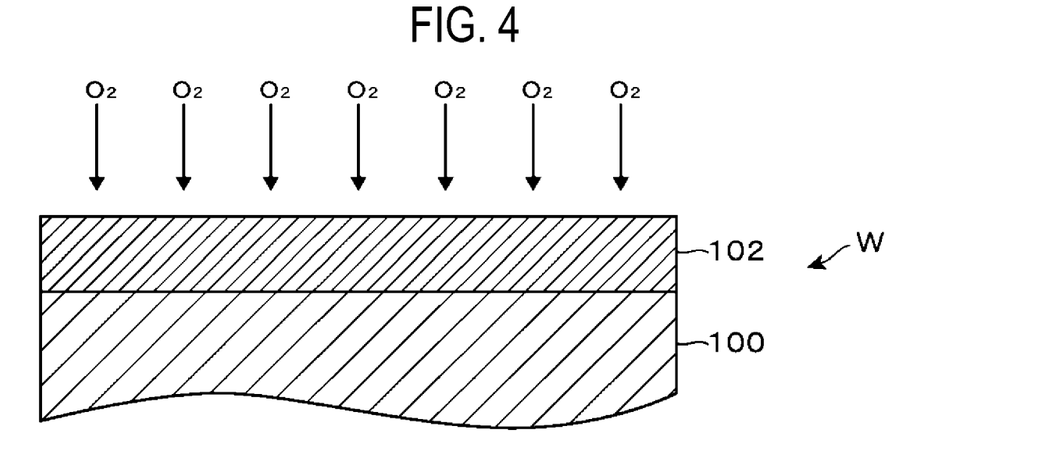
FIG. 4 is a third enlarged vertical cross-sectional view illustrating a step of removing the phosphorus-doped silicon film.

As described above, by performing the oxidation process on the wafer W having the structure illustrated in FIG. 2, the entire layer of the P-doped silicon film 101, which is easily oxidized, is turned into the silicon oxide film 102 (FIG. 4). Meanwhile, since the undoped silicon film 100 is formed below the P-doped silicon film 101, the undoped silicon film 100 is left as it is due to the fact that the undoped silicon film 100 is not directly supplied with $O_2$ and the fact that the undoped silicon film 100 is less likely to be oxidized compared with the P-doped silicon film 101.

Figure 5:
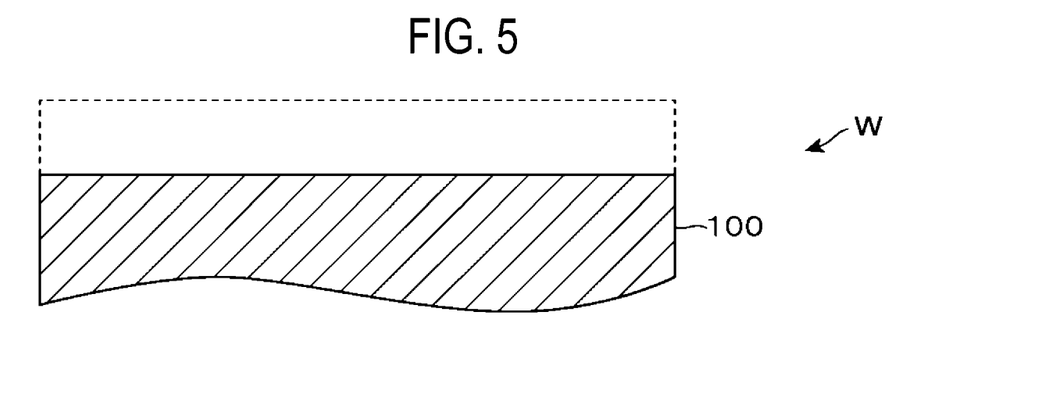
FIG. 5 is a fourth enlarged vertical cross-sectional view illustrating a step of removing the phosphorus-doped silicon film.

Thereafter, the wafer W is transferred to an apparatus, for example, a wet etching apparatus, for etching the silicon oxide film 102. Then, wet etching of the silicon oxide film 102 is performed using, for example, diluted hydrogen fluoride (DHF). The silicon oxide film 102 is easily etched with DHF, whereas the undoped silicon film 100 is hardly etched with DHF. By performing the etching using such a difference in etching selectivity, it is possible to remove the silicon oxide film 102 with the undoped silicon film 100 left as illustrated in FIG. 5.

Through the method described above, it is possible to remove the P-doped silicon film 101 from the wafer W illustrated in FIG. 1, and to expose the undoped silicon film 100 as a lower layer while suppressing the etching of the undoped silicon film 100.

According to the embodiment described above, when removing the P-doped silicon film 101 from the wafer W in which the P-doped silicon film 101 is formed on the upper surface of the undoped silicon film 100, the process of oxidizing the P-doped silicon film 101 is performed first. Since the P-doped silicon film 101 is more easily oxidized than the undoped silicon film 100, it is possible to turn the P-doped silicon film 101 into the silicon oxide film 102 without substantially oxidizing the undoped silicon film 100. Then, the silicon oxide film 102 is etched using the difference in the etching selectivity between the silicon oxide film 102 and the undoped silicon film 100. This makes it possible to remove the P-doped silicon film 101 while suppressing the etching of the undoped silicon film 100.

Here, the film removing method according to the present disclosure may be applied to a method of removing the P-doped silicon film 101 in the configuration in which both the P-doped silicon film 101 and the undoped silicon film 100 are exposed on the surface of the wafer W. There is a large difference in the ease of oxidation between the P-doped silicon film 101 and the undoped silicon film 100. Therefore, even when both the P-doped silicon film 101 and the undoped silicon film 100 are exposed on the surface of the wafer W, it is possible to selectively oxidize the P-doped silicon film 101 and turn the same into the silicon oxide film 102. Subsequently, by etching the silicon oxide film 102, it is possible to remove the P-doped silicon film 101 while leaving the undoped silicon film 100 on the surface of the wafer W.

In addition, in the configuration in which the P-doped silicon film 101 is stacked on the undoped silicon film 100, it is not essential that the undoped silicon film 100 and the P-doped silicon film 101 are directly stacked one above the other. An additional film, for example, a film that can be removed together with the silicon oxide film 102 using an etchant such as DHF, may be formed between the undoped silicon film 100 and the P-doped silicon film 101 in the wafer W. In this case, the additional film may be oxidized together with the P-doped silicon film 101 when the above-mentioned oxidation process is performed.

Here, as shown in test results to be described later, it was found that the P-doped silicon film 101 tends to be easily oxidized as the concentration of P increases. Therefore, in order to ensure a sufficient difference in the ease of oxidation between the P-doped silicon film 101 and the undoped silicon film 100, the concentration of P contained in the P-doped silicon film 101 is preferably $1.5 \times 10^{20}$ atoms/cm³ or more.

In addition, the P-doped silicon film 101 may be a film obtained by doping an amorphous silicon film with P. Further, the P-doped silicon film 101 may be a film obtained by doping monosilicon or polysilicon with P. In either case, it is possible to remove the P-doped silicon film 101 while leaving the undoped silicon film 100 using the technique according to the present disclosure.

Figure 6:
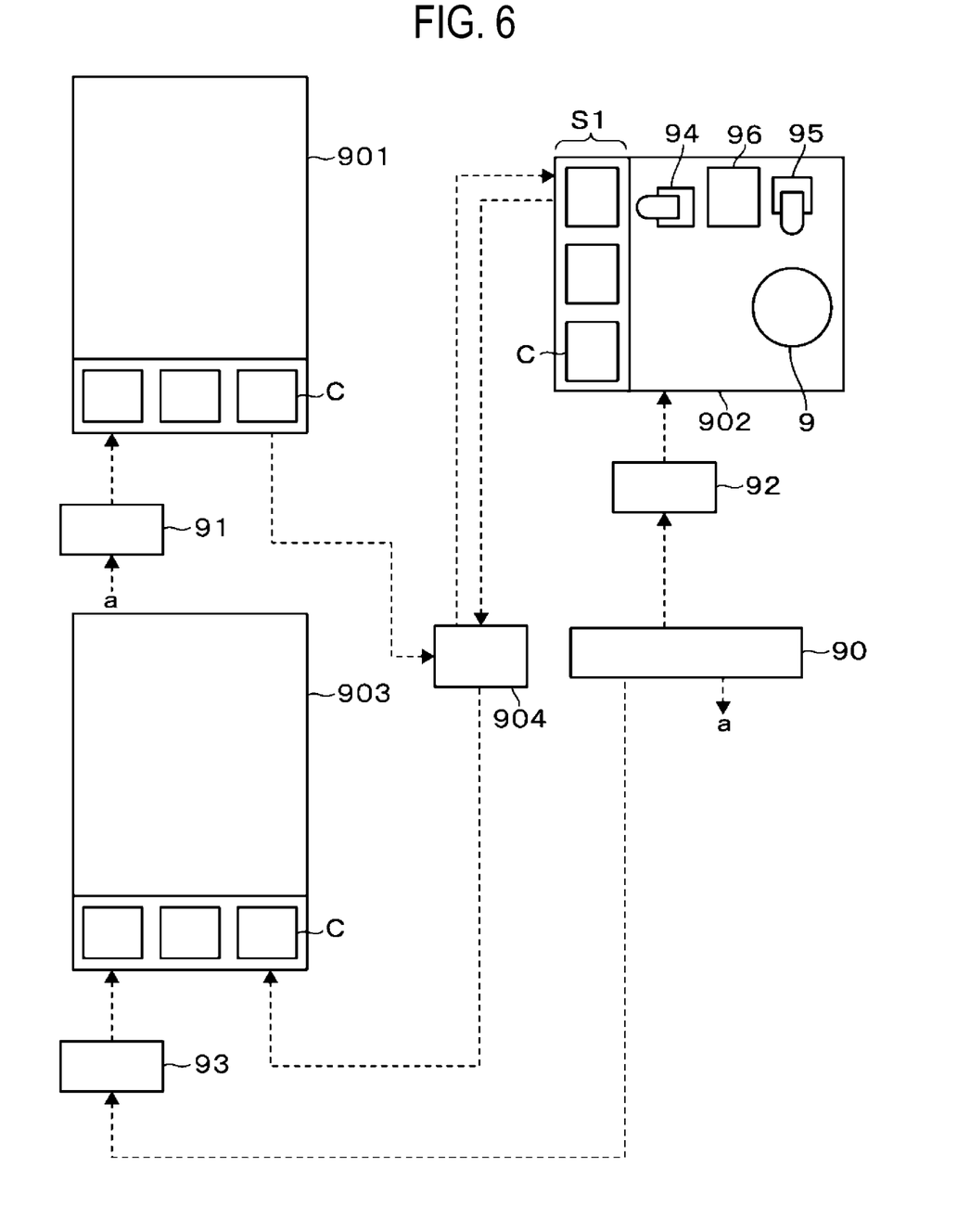
FIG. 6 is a plan view illustrating a substrate processing system according to the present disclosure.

Next, a system (a substrate processing system) for performing the film removing method according to the present disclosure will be described. As illustrated in FIG. 6, the substrate processing system includes an apparatus 901 (a third apparatus) configured to perform etching prior to the oxidation process for the wafer W, an apparatus 902 (a first apparatus) configured to form the silicon oxide film 102 by oxidizing the P-doped silicon film 101, and an apparatus 903 (a second apparatus) configured to etch the silicon oxide film 102. The substrate processing system further includes a transfer device 904, which is a transfer mechanism configured to transfer the wafer W to each of the apparatuses 901 to 903. Reference numeral C in FIG. 6 indicates carriers in each of which the wafer W is accommodated when the wafer W is transferred between the apparatuses. The transfer mechanism may be configured by an OHT (overhead hoist transfer) that transfers the carrier C along a rail provided on the ceiling of a factory provided with the substrate processing system.

As the apparatus 901 configured to perform the etching prior to the oxidation process for the wafer W, for example, a dry etching apparatus configured to supply a chlorine ($Cl_2$) gas toward the wafer W, which is taken out from the carrier C and placed on a stage inside a processing container (not illustrated), may be used. In addition, etching may be performed through CMP (chemical mechanical polishing). As the apparatus 903 configured to etch the silicon oxide film 102, for example, a wet etching apparatus configured to immerse the wafer W in a liquid tank, in which DHF as an etching solution is stored to etch the silicon oxide film 102, may be used.

As the apparatus 902 configured to oxidize the P-doped silicon film 101 so as to form the silicon oxide film 102, for example, a heat treatment apparatus including a vertical heat treatment furnace 9, which performs a thermal oxidation process on the wafer W, may be used. The heat treatment apparatus includes a carrier block Si in which the carrier C is transferred, a delivery mechanism 94 configured to take out the wafer from the carrier C, a placement shelf 96 configured to place the wafer W taken out from the carrier C thereon, and a moving mechanism 95 configured to move the wafer W placed on the placement shelf 96 to the vertical heat treatment furnace 9.

Figure 7:
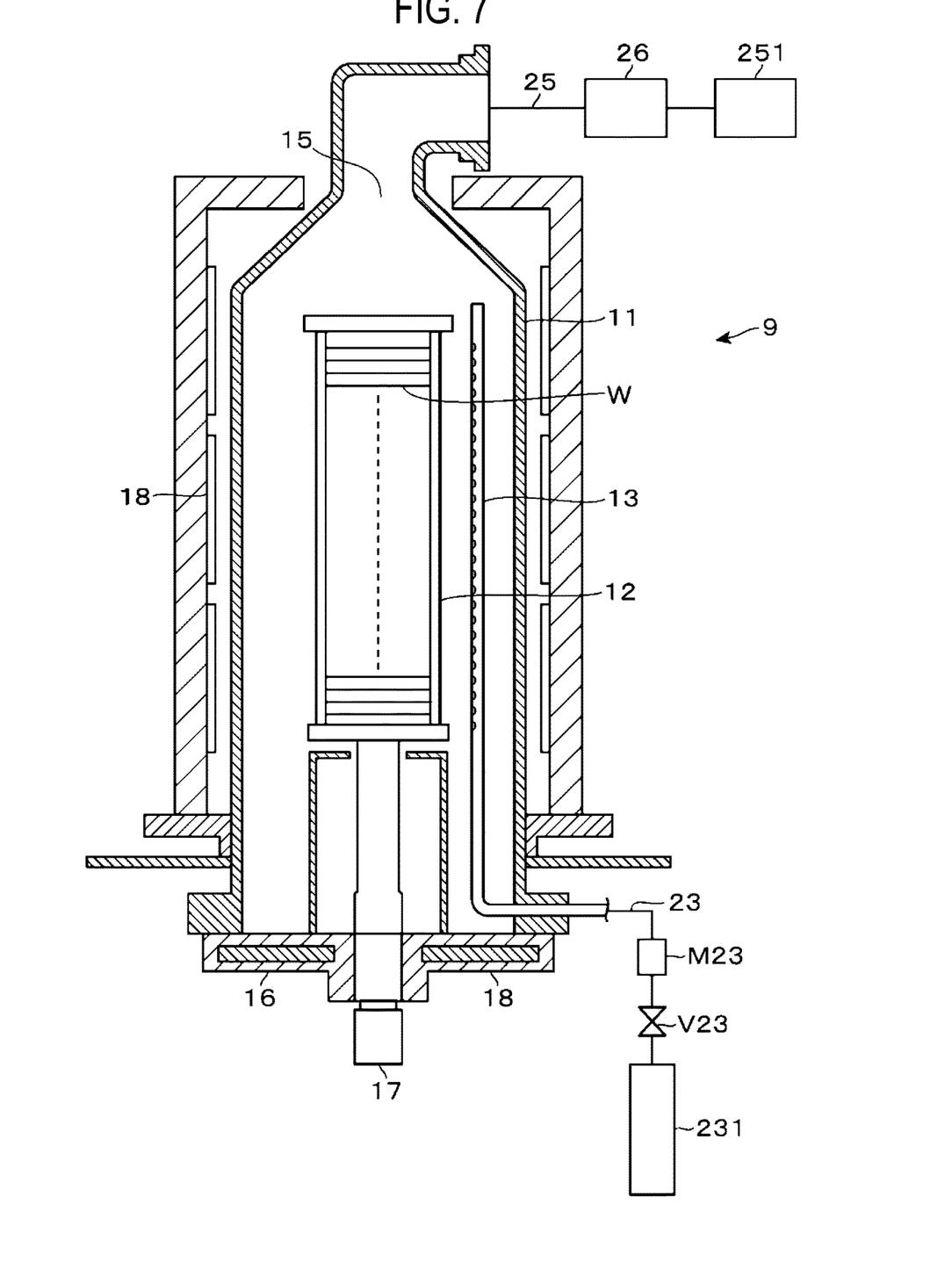
FIG. 7 is a vertical cross-sectional view illustrating a vertical heat treatment furnace provided in the substrate processing system.

As illustrated in FIG. 7, in the vertical heat treatment furnace 9, a shelf-shaped wafer boat 12 in which a large number of wafers W are loaded is airtightly accommodated from below in a reaction tube 11, which is a processing container made of a quartz glass. A gas injector 13 is arranged inside the reaction tube 11 along a longitudinal direction of the reaction tube 11. The gas injector 13 is connected to an $O_2$ gas source 231 through, for example, a gas supply path 23. Reference numeral V23 in FIG. 7 indicates a valve, and reference numeral M23 indicates a flow adjustment part.

An exhaust port 15 is formed in an upper end portion of the reaction tube 11. The exhaust port 15 is connected to an exhaust mechanism 251 via a metal-made vacuum exhaust path 25 including a pressure adjustment valve 26. The pressure adjustment valve 26 is provided to be capable of opening/closing the vacuum exhaust path 25, and serves to adjust an internal pressure of the reaction tube 11 by increasing or decreasing the conductance of the exhaust path through the adjustment of an opening degree of the exhaust path. As the pressure adjustment valve 26, a valve for adaptive pressure control (APC), such as a butterfly valve, may be used. In FIG. 7, reference numeral 16 indicates a lid configured to open/close a lower end opening of the reaction tube 11, and reference numeral 17 indicates a rotation mechanism configured to rotate the wafer boat 12 around a vertical axis. A heater 18 is provided around the reaction tube 11 and in the lid 16 to heat the wafers W loaded into the wafer boat 12 to 800 degrees C. In this vertical heat treatment furnace 9, heat treatment is performed while supplying the $O_2$ gas to the wafers W. As a result, it is possible to oxidize the P-doped silicon film 101.

The apparatus 901 configured to perform etching prior to the oxidation process for the wafer W, the apparatus 902 configured to form the silicon oxide film 102, and the apparatus 903 configured to etch the silicon oxide film 102 are provided with controllers 91 to 93, respectively. In addition, the substrate processing system includes a higher-level computer 90 configured to transmit control signals to the controllers 91 to 93 and to control the transfer of the carrier C by the transfer device 904. The controllers 91 to 93 and the higher-level computer 90 store a program for executing the film removing method described above.

In addition, the apparatus 902 for forming the silicon oxide film 102 may be, for example, an apparatus configured to oxidize the P-doped silicon film 101 by heating the wafer W while supplying water vapor to the wafer W.

It should be noted that the embodiments disclosed herein are exemplary in all respects and are not restrictive. The above-described embodiments may be omitted, replaced or modified in various forms without departing from the scope and spirit of the appended claims.

EXAMPLES (Test 1)

The following preliminary tests were conducted in order to verify the effects of the film removing method according to the present disclosure. The wafer W on which an amorphous silicon film (having a thickness of 1 μm or more) is formed was used as Sample 1. The wafer W on which a phosphorus-doped amorphous silicon film (the concentration of P in the film was $8.0 \times 10^{20}$ atoms/cm³ and a thickness of 1 μm or more) is formed was used as Sample 2. In addition, the wafer W on which a film is formed in the same manner as in Sample 2 except that the concentration of P in the film is $1.5 \times 10^{20}$ atoms/cm³ was used as Sample 3.

For each of Samples 1 to 3, the oxidation process was performed by heating the wafer W at a temperature of 800 degrees C. while supplying the $O_2$ gas in the vertical heat treatment furnace 9 illustrated in FIG. 7, and the thickness of the formed silicon oxide film 102 in terms of the oxidation time [minutes] was measured. The amorphous silicon in each sample is crystallized into polysilicon in the course of raising the temperature to perform the oxidation process.

Figure 8:
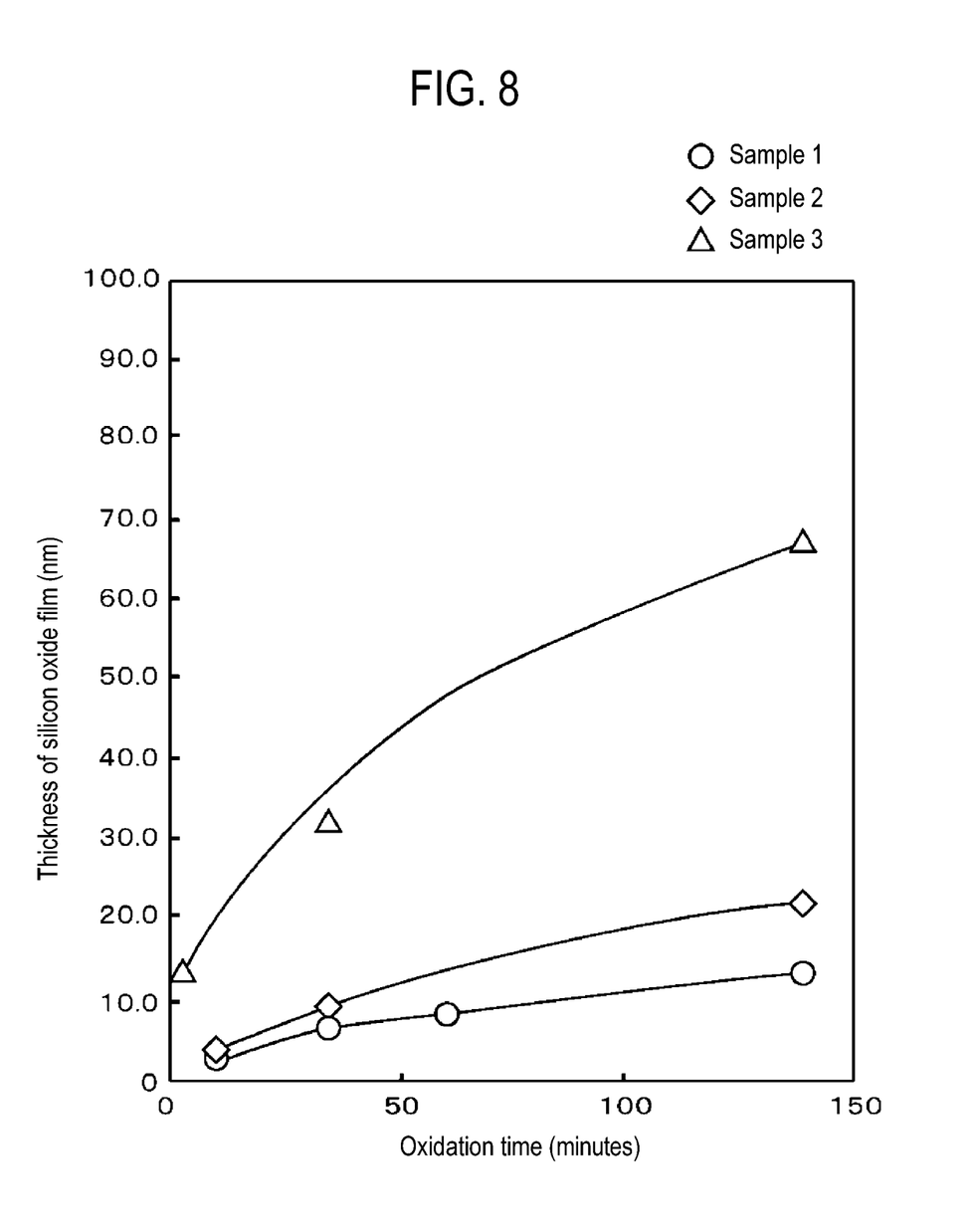
FIG. 8 is a graph showing test results related to a thickness of a silicon oxide film formed with respect to an oxidation time.

The test results are shown in FIG. 8, which shows the film thickness of the silicon oxide film 102 with respect to the oxidation time in each of Samples 1 to 3. Further, assuming that the entire layer of each of the P-doped silicon film 101 and the undoped silicon film 100 is oxidized to form the silicon oxide film 102, a silicon oxide film 102 having a thickness approximately twice that of the initial P-doped silicon film 101 and the undoped silicon film 100 was formed. That is, in FIG. 8, the fact that the formed silicon oxide film 102 has a thickness of 30 nm means that the P-doped silicon film 101 having a film thickness of 15 nm or the undoped silicon film 100 has been oxidized.

As illustrated in FIG. 8, compared with Sample 1, in each of Samples 2 and 3, the silicon oxide film 102 having a relatively thick thickness was formed in a short period of time. Therefore, it can be said that Samples 2 and 3 (the P-doped silicon film 101) are more easily oxidized than Sample 1 (the undoped silicon film 100, which is not doped with phosphorus).

Specifically, during a period when the silicon oxide film 102 having a film thickness of about 5.5 nm (an amount of decrease in the film thickness of the undoped silicon film 100 being 2.5 to 3 nm) is formed (where the oxidation time was 35 minutes) in Sample 1, the silicon oxide film 102 having a film thickness of 30 nm (an amount of decrease in the film thickness of the P-doped silicon film 101 being 15 nm) was formed in Sample 2. Therefore, since the formation rate of the silicon oxide film 102 was higher in the P-doped silicon film 101 than in the undoped silicon film 100, it can be evaluated that the P-doped silicon film 101 has a property of being easily oxidized.

Further, comparing Sample 2 and Sample 3, the formation rate of the silicon oxide film 102 was higher in Sample 2. Therefore, by increasing the concentration of P in the P-doped silicon film 101, it is possible to further facilitate the oxidation of the P-doped silicon film 101.

In addition, as a result of oxidizing the above-mentioned Samples 1 and 2 by the wet oxidizing apparatus that heats the wafers W while supplying water vapor in Samples 1 and 2, the silicon oxide film 102 having a thickness of 9 nm was formed when the oxidation time was 5 minutes in Sample 1, whereas the silicon oxide film 102 having a thickness of 60 nm was formed in Sample 2.

As a result of comparison, the ratios of oxidation rates of Samples 1 and 2 in the case where the oxidation process was performed while supplying the $O_2$ gas to the wafers W and the case where the oxidation process was performed while supplying water vapor to the wafers W were almost the same. As described above, it can be said that the apparatus for forming the silicon oxide film 102 may be configured to heat the wafers W while supplying water vapor to the wafers W.

(Test 2)

The oxidation process was performed on the wafer W having the same configuration as the example in which the undoped silicon film 100 having a thickness of 15 nm was formed as a lower layer and the P-doped silicon film 101 having a thickness of 15 nm was formed as an upper layer, at a heating temperature of 800 degrees C. while supplying the $O_2$ gas using the vertical heat treatment furnace 9 illustrated in FIG. 7.

As a result of confirming the progress of oxidation in terms of the elapsed time of the oxidation process, the P-doped silicon film 101 was completely oxidized and turned into the silicon oxide film 102 after 30 minutes. Meanwhile, when heating was performed for 40 minutes, the undoped silicon film 100 was hardly oxidized, and the thickness of the formed silicon oxide film 102 was 0.3 nm.

According to the test results described above, it can be said that, even if the oxidation process of oxidizing the P-doped silicon film 101 to form the silicon oxide film 102 is performed, it is possible to leave the undoped silicon film 100 in the initial state without being substantially oxidized.

Therefore, it can be said that, by removing the silicon oxide film 102 using an etchant having a high etching selectivity to the silicon oxide film 102, it is possible to remove the P-doped silicon film 101 while suppressing the removal of the undoped silicon film 100.

According to the present disclosure, it is possible to remove a phosphorus-doped silicon film from a substrate including the phosphorus-doped silicon film and an undoped silicon film with good selectivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of removing a phosphorus-doped silicon film doped with phosphorus, the method comprising:
    providing a substrate including a phosphorus-doped silicon film and an undoped silicon film which is not doped with phosphorus, wherein at least the phosphorus-doped silicon film is exposed to a surface of the substrate;
    forming a silicon oxide film by oxidizing the phosphorus-doped silicon film among the phosphorus-doped silicon film and the undoped silicon film;
    selectively etching and removing the silicon oxide film among the silicon oxide film and the undoped silicon film; and
    etching the phosphorus-doped silicon film such that the phosphorus-doped silicon has a thickness in a range of 10 nm to 100 nm, before the forming the silicon oxide film.

2. The method of claim 1, wherein the phosphorus-doped silicon film is stacked on the undoped silicon film in the substrate.

3. The method of claim 2, wherein forming the silicon oxide film is performed by supplying oxygen or water vapor to the substrate and heating the substrate.

4. The method of claim 3, wherein a concentration of the phosphorus in the phosphorus-doped silicon film is $1.5 \times 10^{20}$ atoms/cm$^3$ or more.

5. The method of claim 1, wherein forming the silicon oxide film is performed by supplying oxygen or water vapor to the substrate and heating the substrate.

6. The method of claim 1, wherein a concentration of the phosphorus in the phosphorus-doped silicon film is $1.5 \times 10^{20}$ atoms/cm$^3$ or more.

7. A system for removing a phosphorus-doped silicon film doped with phosphorus, comprising:
    a first apparatus configured to form a silicon oxide film by oxidizing the phosphorus-doped silicon film in a substrate including the phosphorus-doped silicon film and an undoped silicon film which is not doped with phosphorus, wherein at least the phosphorus-doped silicon film is exposed to a surface of the substrate;
    a second apparatus configured to etch the silicon oxide film;
    a third apparatus configured to etch the phosphorus-doped silicon film before the substrate is oxidized by the first apparatus;

a transfer mechanism configured to transfer the substrate; and a controller, wherein the controller is configured to perform a control for executing:
- a step of forming the silicon oxide film by oxidizing the phosphorus-doped silicon film among the phosphorus silicon film and the undoped silicon film by the first apparatus,
- a step of transferring the substrate on which the silicon oxide film is formed to the second apparatus by the transfer mechanism,
- a step of selectively etching and removing the silicon oxide film among the silicon oxide film and the undoped silicon film by the second apparatus,
- a step of etching the phosphorus-doped silicon film by the third apparatus such that the phosphorus-doped silicon film has a thickness in a range of 10 nm to 100 nm, before the step of forming the silicon oxide film, and
- a step of transferring the substrate in which the phosphorus-doped silicon film has been subjected to the etching the phosphorus-doped silicon film to the first apparatus by the transfer mechanism.

8. The system of claim 7, wherein the phosphorus-doped silicon film is removed from the substrate in which the phosphorus-doped silicon film is stacked on the undoped silicon film.

9. The system of claim 8, wherein the first apparatus forms the silicon oxide film by supplying oxygen or water vapor to the substrate and heating the substrate.

10. The system of claim 9, wherein the phosphorus-doped silicon film is removed from the substrate on which the phosphorus-doped silicon film having a concentration of $1.5 \times 10^{20}$ atoms/cm$^3$ or more in terms of the phosphorus is formed.

11. The system of claim 7, wherein the first apparatus forms the silicon oxide film by supplying oxygen or water vapor to the substrate and heating the substrate.

12. The system of claim 7, wherein the phosphorus-doped silicon film is removed from the substrate on which the phosphorus-doped silicon film having a concentration of $1.5 \times 10^{20}$ atoms/cm$^3$ or more in terms of the phosphorus is formed.

* * * * *